United States Patent
Mauder et al.

(10) Patent No.: US 8,288,258 B2
(45) Date of Patent: Oct. 16, 2012

(54) METHOD FOR PRODUCING A SEMICONDUCTOR

(75) Inventors: Anton Mauder, Kolbermoor (DE);
Hans-Joachim Schulze, Taufkirchen (DE); Helmut Strack, Munich (DE);
Hans-Joerg Timme, Ottobrunn (DE);
Wolfgang Werner, Munich (DE)

(73) Assignee: Infineon Technologies Austria AG, Villach (AT)

( * ) Notice: Subject to any disclaimer, the term of this patent is extended or adjusted under 35 U.S.C. 154(b) by 175 days.

(21) Appl. No.: 12/769,976

(22) Filed: Apr. 29, 2010

(65) Prior Publication Data

US 2010/0210091 A1    Aug. 19, 2010

Related U.S. Application Data

(63) Continuation-in-part of application No. 12/474,464, filed on May 29, 2009, now abandoned.

(51) Int. Cl.
*H01L 21/306* (2006.01)

(52) U.S. Cl. .............. 438/530; 257/E21.215; 438/705

(58) Field of Classification Search .......... 257/E21.215, 257/E21.216; 438/517, 530, 527, 705
See application file for complete search history.

(56) References Cited

U.S. PATENT DOCUMENTS

| | | | |
|---|---|---|---|
| 5,071,510 A | 12/1991 | Findler et al. | |
| 5,256,581 A * | 10/1993 | Foerstner et al. | 438/459 |
| 5,270,221 A * | 12/1993 | Garcia et al. | 438/67 |
| 5,445,718 A | 8/1995 | Wang | |
| 7,132,321 B2 * | 11/2006 | Kub et al. | 438/172 |
| 2006/0035436 A1 * | 2/2006 | Schulze | 438/345 |

FOREIGN PATENT DOCUMENTS

| | | |
|---|---|---|
| DE | 4035628 A1 | 5/1992 |
| DE | 10243758 A1 | 4/2004 |
| DE | 10245091 A1 | 4/2004 |
| DE | 102006002903 A1 | 8/2007 |
| EP | 0253420 A1 | 1/1988 |

OTHER PUBLICATIONS

Huster et al. "Etch-stop behaviour of depletion layers." J. Micromech. Microeng. 3 (1993) 149-151.*

* cited by examiner

*Primary Examiner* — Julio J Maldonado
*Assistant Examiner* — Daniel Shook
(74) *Attorney, Agent, or Firm* — Dicke, Billig & Czaja, PLLC

(57) ABSTRACT

A method for producing a semiconductor includes providing a p-doped semiconductor body having a first side and a second side; implanting protons into the semiconductor body via the first side to a target depth of the semiconductor body; bonding the first side of the semiconductor body to a carrier substrate; forming an n-doped zone in the semiconductor body by heating the semiconductor body such that a pn junction arises in the semiconductor body; and removing the second side of the semiconductor body at least as far as a space charge zone spanned at the pn junction.

42 Claims, 8 Drawing Sheets

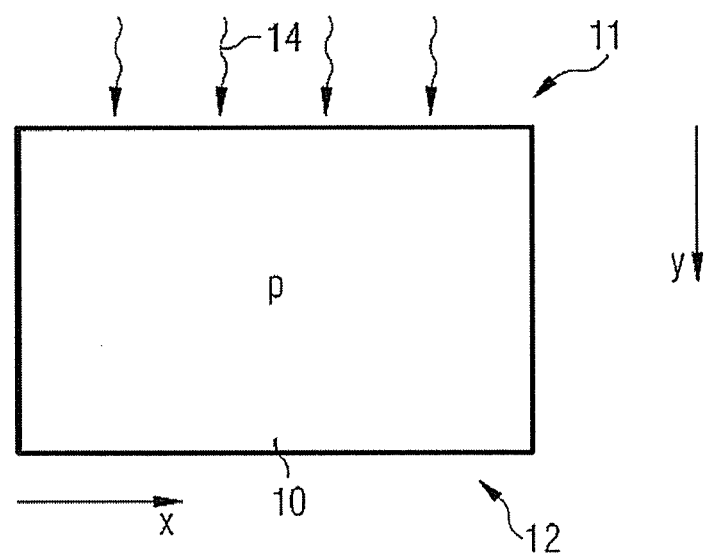
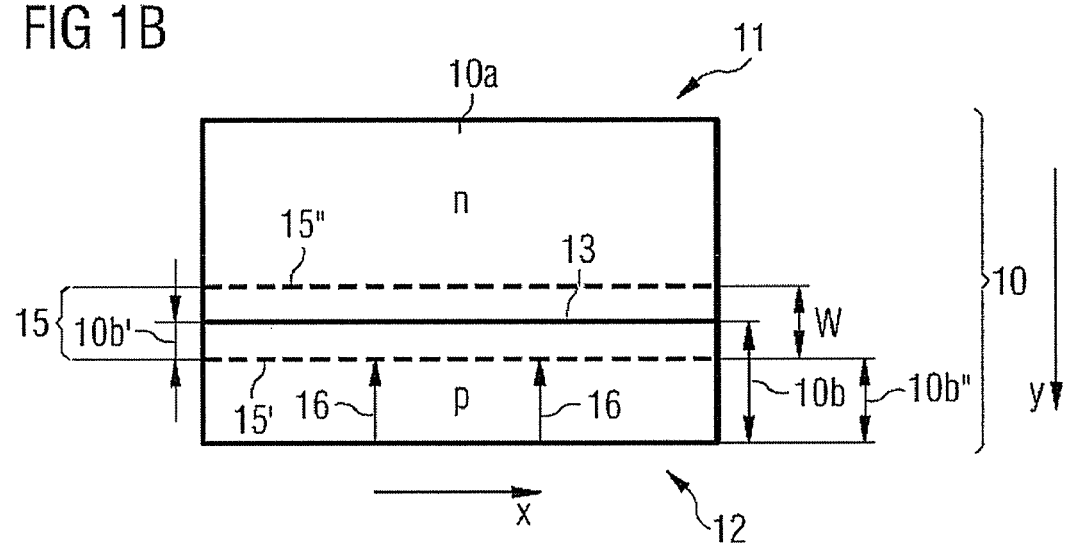

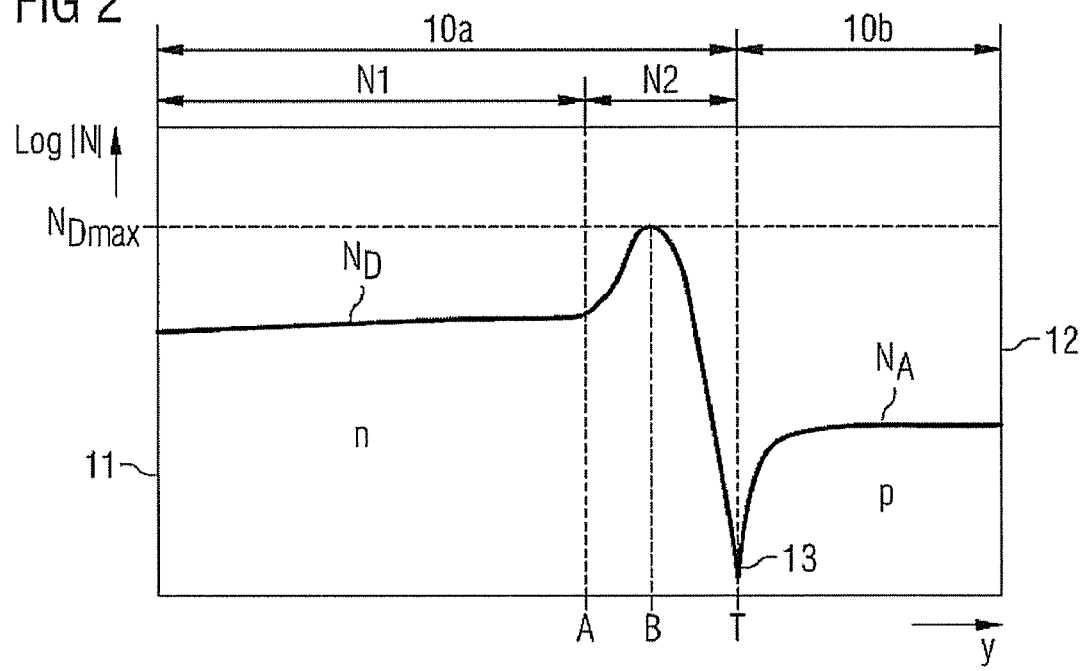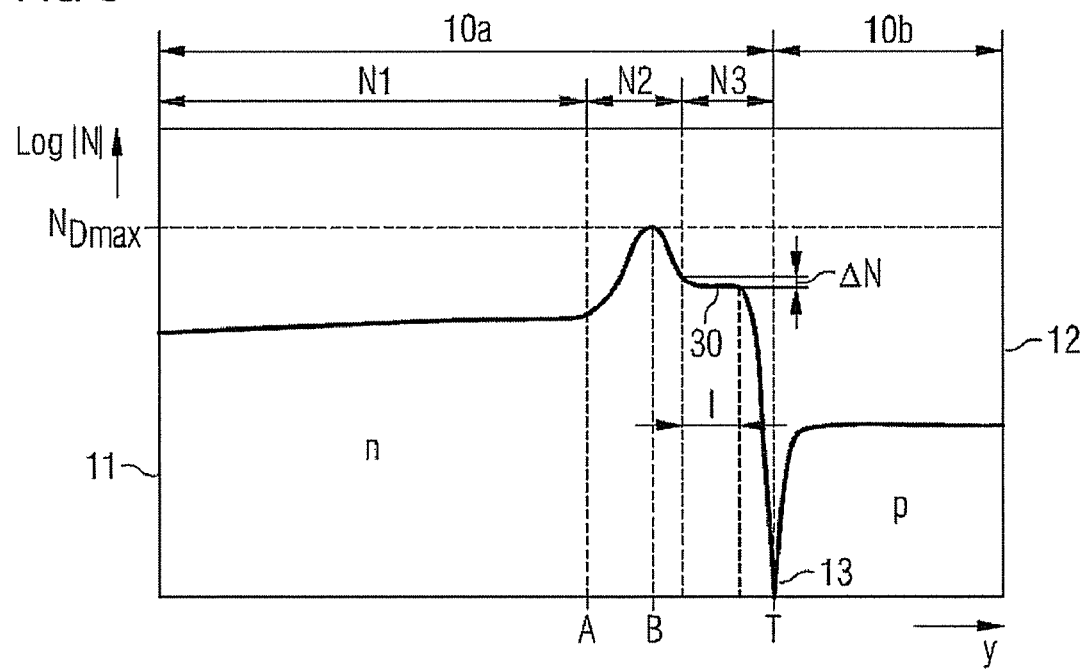

US 8,288,258 B2

METHOD FOR PRODUCING A SEMICONDUCTOR

CROSS-REFERENCE TO RELATED APPLICATIONS

This Utility Patent Application is a continuation-in-part of U.S. patent application Ser. No. 12/474,464 filed on May 29, 2009, which claims priority to German Patent Application No. DE 10 2008 025 733.8 filed on May 29, 2008, both of which are incorporated herein by reference.

BACKGROUND

One embodiment of the invention relates to a method for producing a thin semiconductor body and to the use of the method for producing a power semiconductor component. Another embodiment of the invention relates to a method for producing a silicon on insulator (SOI) material.

For a multiplicity of applications of electronic semiconductor components and integrated circuits (IC), it is advantageous to restrict the total thickness of the semiconductor components and of the integrated circuits. Thus, for example, in disposable electronics and for chip cards and smart cards, a very small mass and a very small structural height are of importance. By using targeted settings of the thickness of the semiconductor body used, the electrical properties of e.g., vertical power semiconductor components can be improved by adapting the thickness of the semiconductor body to the voltage class of the respective power semiconductor component, in order to avoid unnecessary electrical resistance through over-dimensioned semiconductor bodies. However, this necessitates a very precise and reproducible thickness setting over the entire area of the semiconductor body used, in order to avoid losses of yield in production and in order to ensure reliable electrical properties of the semiconductor component and of the integrated circuit.

For these and other reasons, there is a need for the present invention.

BRIEF DESCRIPTION OF THE DRAWINGS

The accompanying drawings are included to provide a further understanding of embodiments and are incorporated in and constitute a part of this specification. The drawings illustrate embodiments and together with the description serve to explain principles of embodiments. Other embodiments and many of the intended advantages of embodiments will be readily appreciated as they become better understood by reference to the following detailed description. The elements of the drawings are not necessarily to scale relative to each other. Like reference numerals designate corresponding similar parts.

FIGS. 1A and 1B schematically illustrate one embodiment of a method for thinning a semiconductor body.

FIG. 2 illustrates one embodiment of a doping profile of an n-type dopant after one proton implantation with subsequent heating in a p-doped semiconductor body.

FIG. 3 illustrates one embodiment of a doping profile of an n-type dopant after two proton implantations with subsequent heating in a p-doped semiconductor body.

DETAILED DESCRIPTION

Figure 4:
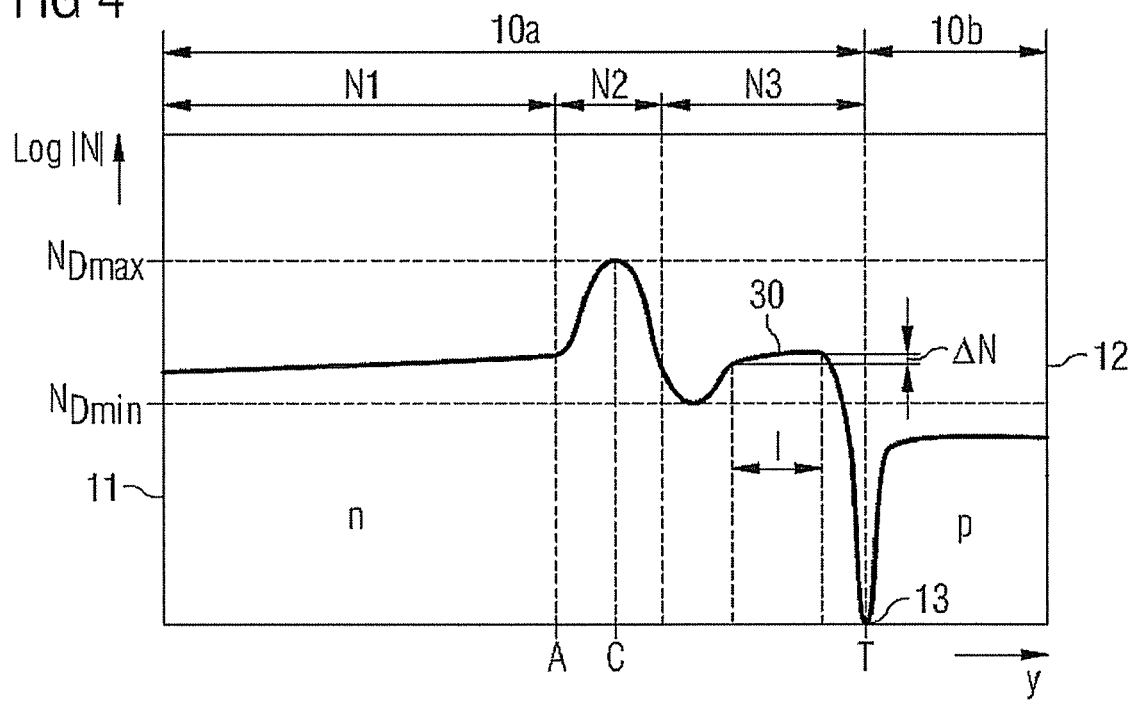
FIG. 4 illustrates one embodiment of a doping profile of an n-type dopant after two proton implantations with subsequent heating in a p-doped semiconductor body.

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

It is to be understood that the features of the various exemplary embodiments described herein may be combined with each other, unless specifically noted otherwise.

Before the exemplary embodiments are explained in more detail below with reference to the figures, it is pointed out that identical elements are provided with the same or similar reference symbols in the Figures and that a repeated description of these elements is omitted. Furthermore, the Figures are not necessarily true to scale; rather, the main emphasis is on elucidating the basic principle.

The term pn junction is defined hereinafter as the location in a semiconductor body at which an n-type dopant concentration $N_D$ of the semiconductor body falls below a p-type dopant concentration $N_A$ of the semiconductor body or a p-type dopant concentration $N_A$ falls below an n-type dopant concentration $N_D$ of the semiconductor body.

One or more embodiments provide a method for producing a semiconductor body which permits an exact and reproducible thinning of the semiconductor body, and the use of this method for producing power semiconductor components. One or more other embodiments provide a method for producing a silicon on insulator (SOI) material or wafer, and the use of this method for producing power semiconductor components.

FIG. 1A illustrates a semiconductor body 10 having a first side 11 and a second side 12, wherein the direction leading from the first side 11 to the second side 12 is designated as the y-direction. The semiconductor body 10 is typically a semiconductor wafer. Such wafers are normally starting products for the mass production of semiconductor components and are available in sizes of currently approximately 750 µm thickness (y-direction) and up to 300 mm diameter (x-direction). The starting semiconductor body 10 used here is doped with a p-type dopant, such that the semiconductor body has a p-type basic doping. The electrical conductivity of the semiconductor body 10 is therefore initially determined by "holes" (p-type charge carriers) as majority carriers. To a certain extent, but with a significantly lower concentration, however, the semiconductor body also already contains conduction electrons (n-type charge carriers) as minority carriers.

Silicon is principally suitable as semiconductor material for the semiconductor body 10. The sheet resistance of the p-doped semiconductor body lies between 1 Ohm cm and 5000 Ohm cm, or between 100 Ohm cm and 5000 Ohm cm, for example. As illustrated in subprocess a) in FIG. 1, protons 14 are implanted into the semiconductor body 10 at the first side 11. Afterward, at least that region of the semiconductor body 10 which has been implanted with protons 14 is subjected to heat treatment, that is to say heated and held at this temperature level for a specific time. This gives rise to an n-doped zone 10a and accordingly a pn junction 13 in the p-doped semiconductor body 10. In one embodiment, the n-doped zone 10a is produced with a proton irradiation dose of between $10^{12}$ cm$^{-2}$ and $10^{15}$ cm$^{-2}$ or between $10^{14}$ cm$^{-2}$ and $10^{15}$ cm$^{-2}$.

Embodiments relate generally to a method for producing a semiconductor body, wherein a p-doped semiconductor body having a first side and a second side is provided, an n-doped zone is formed in the semiconductor body by implantation of protons into the semiconductor body via the first side down to a specific depth of the semiconductor body and by subsequent heating at least of the proton-implanted region of the semiconductor body, such that a pn junction arises in the semiconductor body, and the second side of the semiconductor body is removed at least as far as a space charge zone spanned at the pn junction.

One or more embodiments provide a use of the method for producing the semiconductor body for producing a power semiconductor component, wherein in each case at least one electrode is fitted to the first and to the second side of the semiconductor body produced.

The proton irradiation with subsequent heating makes it possible to produce an n-doped zone and thus a pn junction at an exactly predefined location homogeneously also over a large area in the semiconductor body. As a result of the high penetration depth of protons into a semiconductor body, the pn junction can also be produced at a large depth in the semiconductor body, which cannot be realized by conventional implantation or diffusion techniques. The space charge zone spanned at the pn junction or the pn junction itself can be used for a precise ending of the rear-side removal of the original semiconductor body, thereby enabling an exact and reproducible thinning of the semiconductor body to a desired and predetermined final thickness.

FIG. 1B illustrates an n-doped zone 10a formed in this way and the pn junction 13 in the semiconductor body 10 in subprocess b). The energy of the proton radiation 14 is set in such a way that the pn junction 13 is produced at a predetermined location in the semiconductor body 10. In one embodiment, the position of the pn junction is determined according to the desired final thickness of the semiconductor body 10. Embodiments of the invention provide for the pn junction 13 to be produced at a depth T of 0.5 µm to 350 µm or at a depth T of 20 µm to 350 µm, measured from the surface of the first side 11. In the case of a silicon semiconductor body, the proton radiation energy here lies in the range of between 0.055 MeV and 8 MeV or between 1 MeV and 8 MeV, respectively. In principle the proton radiation energy correlates with the penetration depth of the protons into the semiconductor material used. The higher the proton radiation energy used, the larger the penetration depth of the protons into the semiconductor material used.

The heating (heat treatment) of the semiconductor body 10 that is effected after the proton irradiation in one or more embodiments includes an annealing phase in the range of between 350° C. and 550° C., since the hydrogen-induced n-type doping forms in this temperature range. In one embodiment, the annealing phase is effected at temperatures of between 450° C. and 520° C. In one embodiment, the annealing phase is carried out for at least 15 minutes and can also take place over a number of hours.

After the formation of the n-doped zone 10a and the pn junction 13, in thermodynamic equilibrium as a result of diffusion of charge carriers across the pn junction 13, a space charge zone 15 forms as far as a boundary 15" in the n-doped zone 10a and as far as a boundary 15' in the remaining p-doped semiconductor body 10b, since a high concentration difference exists between the n-doped zone 10a and the remaining p-doped semiconductor body 10b. As a result of the fixed charges remaining, the previously electrically neutral crystals have now acquired a space charge that charges the p-type crystal negatively and the n-type crystal positively. The resultant electrical voltage is called the diffusion voltage $U_D$.

By applying an external bias voltage across the pn junction 13, the boundaries 15' and 15" can be displaced and the width W of the space charge zone can thus be controlled. By applying the external bias voltage in the reverse direction of the pn junction 13 (+ at the n-doped zone 10a, − at the remaining p-doped semiconductor body 10b), by way of example, the width W of the space charge zone 15 is increased. If the external bias voltage is polarized in the forward direction of the pn junction 13 (− at the n-doped zone 10a, + at the remaining p-doped semiconductor body 10b), the width W of the space charge zone 15 is decreased. As soon as the external bias voltage with polarization in the forward direction is greater than or equal to the diffusion voltage, the space charge zone 15 is dissolved, that is to say that the boundaries 15' and 15" fall on top of one another and the width W of the space charge zone is equal to zero.

After the formation of pn junction 13 and a space charge zone 15 that possibly occurs, the semiconductor body 10 is thinned. In the case where a space charge zone 15 is spanned at the pn junction 13, this takes place by removing the second side 12 of the semiconductor body 10 in the negative y-direction as far as the space charge zone 15, that is to say as far as the boundary 15' of the space charge zone 15 that is situated in the residual p-doped semiconductor body 10b, as is illustrated by arrows 16 in FIG. 1B. Consequently, a region 10b" of the semiconductor body is removed, while a residue 10b' of the p-doped semiconductor body 10 remains in the thinned state at the second side.

By way of example, by using suitable setting of the bias voltage value across the pn junction, the space charge zone can be extended up to 5 µm into the residual p-doped semiconductor body, which results in a correspondingly thick p-doped residual layer 10b' after the thinning In the case of a dissolved space charge zone 15, the second side is removed as far as the pn junction 13, that is to say that the residue 10b of the p-doped semiconductor body that remained from the original semiconductor body 10 after the production of the n-doped zone 10a is completely removed.

The removal of the second side 12 can in any case be effected in a locally delimited manner by using masks, for example, or else over the whole area over the entire semiconductor body 10. The removal is generally effected at least in part by using an electrochemical etching method wherein the boundary 15" of the space charge zone or, in the absence of a space charge zone, the pn junction is used as an "etching stop" for ending the etching process. When this "etching stop" is reached, the etching process automatically terminates; in other words, the etching stop is effected in a self-aligned manner in this way. A very exact removal of the second side 12 of the semiconductor body 10 is thus possible. By way of example, a characteristic change in a current flowing within the electrochemical etching apparatus is measured when the "etching stop" is reached, which is used for ending the etching process. If desired, after exactly removing of the second side 12 of the semiconductor body 10, additionally a small portion or all of residual layer 10b can be removed by using an additional etching step or chemical mechanical polishing step. If desired, this further removal of semiconductor material can even extend into the n-doped zone 10a. Mechanical removal methods can also be used at the beginning of the removal of the second side 12 of the semiconductor body 10.

FIG. 2 illustrates one embodiment of a doping profile of an n-doped zone 10a produced according to the method described above in a p-doped semiconductor body 10. The n-doped zone 10a extends from the surface of the first side 11 of the semiconductor body 10 as far as the pn junction 13 at a depth T into the semiconductor body 10. The n-doped zone 10a has a region N1 having a virtually constant n-type dopant concentration $N_D$, that is to say that the n-doped dopant concentration $N_D$ changes typically by at most a factor of 3 in the region N1. The region N1 extends within the n-doped zone 10a from the surface of the first side 11 as far as the depth A. Typical values for A are in this case 0.4 μm<A<300 μm or 15 μm<A<300 μm.

Between the region N1 and the pn junction 13, a region N2 extends in the n-doped zone 10a, the region N2 having a n-type dopant maximum $N_{Dmax}$ at the depth B in the semiconductor body 10. In this case, the n-type dopant maximum $N_{Dmax}$ is produced at the location of the highest proton density originating from the proton implantation. On account of the—in the case of protons—very small variation range of the penetration depth into the semiconductor body 10, the location having the highest proton density is situated virtually at the pn junction 13 ("End-of-Range"). The n-type dopant concentration $N_D$ thus falls very steeply from the n-type dopant maximum $N_{Dmax}$ toward the pn junction 13. The "End-of-Range" region forms the end of the region which is irradiated by the proton implantation and in which the majority of the protons is incorporated during the implantation.

On account of the annealing process, a large portion of the protons diffuses in the negative y-direction toward the first side 11, which results in the doping $N_D$ in the region through which the protons are radiated. The protons that diffuse into the depth of the p-type semiconductor body 10 in the positive y-direction toward the second side 12 do not lead to the formation of donors in this region, since implantation-induced crystal defects required therefore are not present there.

The difference between the maximum doping concentration $N_{Dmax}$ in the "End-of-Range" region and the doping concentration $N_D$ in the n-doped zone 10a is dependent on the temperature during the thermal process and the duration of the thermal process. It holds true here that for the same duration of the thermal process, the difference is all the smaller, the higher the temperature during the thermal process, and that for a given temperature during the thermal process, the difference is all the smaller, the longer the duration of the thermal process.

The energy of the proton irradiation, the proton dose and the annealing temperature and annealing time are chosen so as to produce a sufficient n-type doping maximum $N_{Dmax}$ e.g., for a field stop zone and for forming a pn junction, on the one hand, and for forming a suitable basic doping $N_D$ of the n-doped zone 10a, on the other hand. The n-type basic doping $N_D$ of the n-doped zone 10a can be produced without additional outlay from the production of the pn junction required for the thinning of the semiconductor body 10. In a form that is not illustrated, the n-type dopant maximum $N_{Dmax}$ can be completely reduced by a sufficiently long annealing phase of the proton-implanted region over e.g., a number of hours and can be converted into a virtually constant n-type dopant concentration $N_D$, with the result that the homogeneous region N1 extends from the surface of the first side 11 to shortly before the pn junction 13. However, the n-doped zone 10a can also be produced with an n-type dopant concentration $N_D$ that falls from the n-type dopant maximum $N_{Dmax}$ in the direction toward the first side 11 of the semiconductor body 10.

The p-doped residue 10b of the semiconductor body 10 that remains from the original semiconductor body 10 extends from the pn junction 13 as far as the surface of the second side 12 and has a largely constant p-type dopant concentration $N_A$.

FIG. 3 illustrates one embodiment of a doping profile of an n-doped zone 10a produced according to one embodiment in a p-doped semiconductor body 10. In contrast to the doping profile illustrated in FIG. 2, the depth B of an n-type dopant maximum $N_{Dmax}$ produced in the n-doped zone 10a is spaced apart further from the pn junction 13. However, as in the exemplary embodiment regarding FIG. 2 as well, the n-type dopant maximum $N_{Dmax}$ is still situated nearer to pn junction 13 than to the surface of the first side 11 of the semiconductor body 10 in the region N2. A region N3 having a reduced n-type dopant concentration $N_D$ is additionally formed between the n-type dopant maximum $N_{Dmax}$ and the pn junction 13, wherein the region N3 as illustrated, can have a "shoulder" 30 having an n-type dopant concentration $N_D$ that is virtually constant over a length l. This "shoulder" 30 produced over the length l in the region N3 has, for example, a higher n-type dopant concentration $N_D$ than the region N1. The "shoulder" 30 is defined as the region in which the n-type dopant concentration changes (ΔN) at most by a factor of 3. The n-type dopant concentration $N_D$ in the region of the shoulder 30 should, but need not necessarily, be lower than that of the n-type dopant maximum $N_{Dmax}$ at least by a factor of 5. The length l of the shoulder can be, for example, between 1 μm and 20 μm.

As illustrated in FIG. 4, a region having an n-type dopant minimum $N_{Dmin}$ can also be present between the shoulder 30 having an approximately constant n-type dopant concentration $N_D$ and the region N2, wherein the concentration of the n-type dopant minimum $N_{Dmin}$ can be lower than the dopant concentration $N_D$ in the region of the shoulder 30, for example, by more than a factor of 3.

The region N3 that has a shoulder and is illustrated by way of example in FIG. 3 and FIG. 4 makes it possible to set a well-defined distance between the n-type dopant maximum $N_{Dmax}$ in the region N2 and the pn junction 13. Consequently, it is possible to set e.g., a very readily reproducible efficiency of a rear-side emitter introduced into the wafer surface, which, moreover, can have a relatively small current dependence.

The doping profile illustrated in FIG. 3 and FIG. 4 can be produced, for example, by using a first proton implantation into the p-doped semiconductor body 10 with a subsequent annealing phase over a long time period and a succeeding further proton implantation with an increased implantation energy and decreased implantation dose relative to the first proton implantation. In this case, the duration and the temperature of the annealing phase of the first proton implantation is still chosen to be sufficiently short and low, respectively, that the n-type dopant maximum $N_{Dmax}$ remains in the region N2 of the n-doped zone 10a. The second proton implantation is likewise carried out via the first side 11 of the semiconductor body 10 and annealed, wherein the duration and temperature of this annealing phase are chosen such that the "shoulder" 30 is formed. The n-type dopant minimum $N_{Dmin}$ in FIG. 4 can be produced by short annealing times of the second proton implantation. The diffusion of the implanted protons in the direction of the n-type dopant maximum $N_{Dmax}$ then extends only as far as the n-type dopant minimum $N_{Dmin}$.

Figure 5:
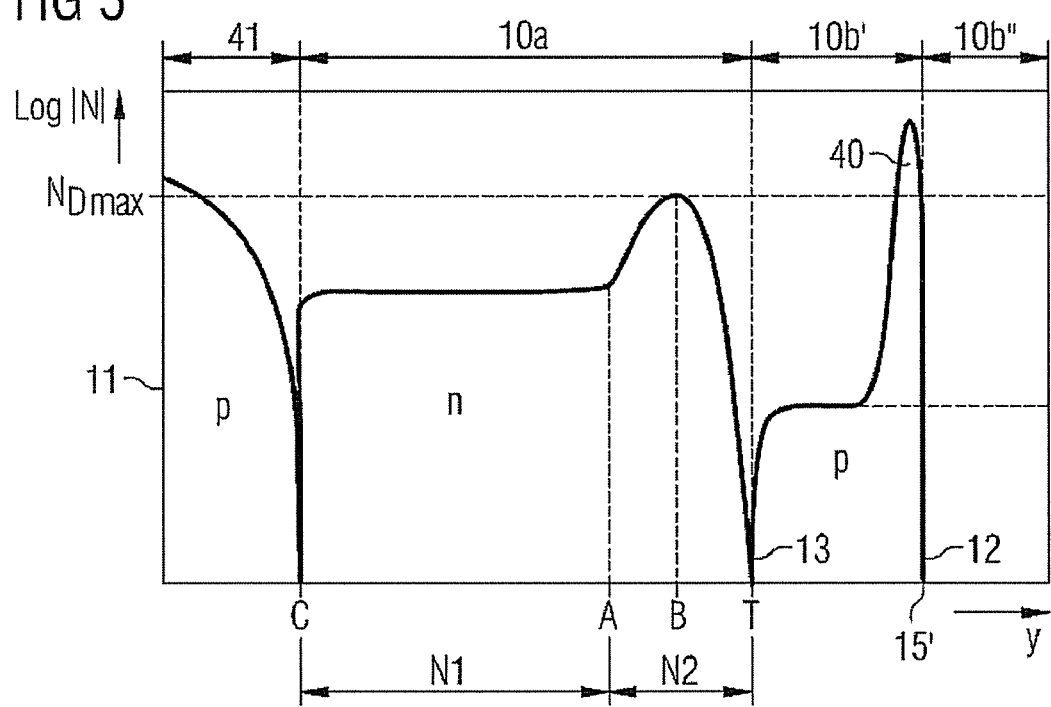
FIG. 5 illustrates one embodiment of a doping profile of a semiconductor body for a power semiconductor component.

FIG. 5 illustrates one embodiment of a doping profile of a semiconductor body for a power semiconductor component. The semiconductor body is produced by forming an n-doped zone 10a by using proton implantation and subsequent thinning, as already explained regarding FIG. 1. In this case, the second side 12 is removed as far as the boundary 15' of a space charge zone at the pn junction 13, which is situated, for example, approximately 5 μm in the residual p-doped residue 10b of the semiconductor body as a result of the application of a bias voltage polarized in the reverse direction. As a result of the removal of the second side 12, one part 10b'' of the p-doped residue 10b of the semiconductor body 10 is removed, while another part 10b' of the p-doped residue 10b remains. The part 10b' has a thickness of approximately 5 μm corresponding to the position of the boundary 15'.

At the thinned second side 12 of the semiconductor body 10, an additional p-type doping near the surface is then carried out by indiffusion or implantation in combination with a thermal activation or indiffusion of the implanted atoms of p-type dopant. The resultant "rear-side" highly doped P-type zone 40 can be used, for example, as a p-type emitter for an IGBT.

At the first side 11 of the semiconductor body 10, a p-type doping into the n-doped zone 10a—which initially reaches as far as the surface of the first side 11—is likewise carried out by using diffusion or implantation of p-type dopant, to be precise, for example, before the proton implantation described above is carried out and before the thinning process described. This gives rise to a p-doped zone 41 which, at the surface of the first side 11, reaches down to a depth C and which, together with the n-doped zone 10a, forms a further pn junction at a depth C near the surface at the first side of the semiconductor body.

Figure 6:
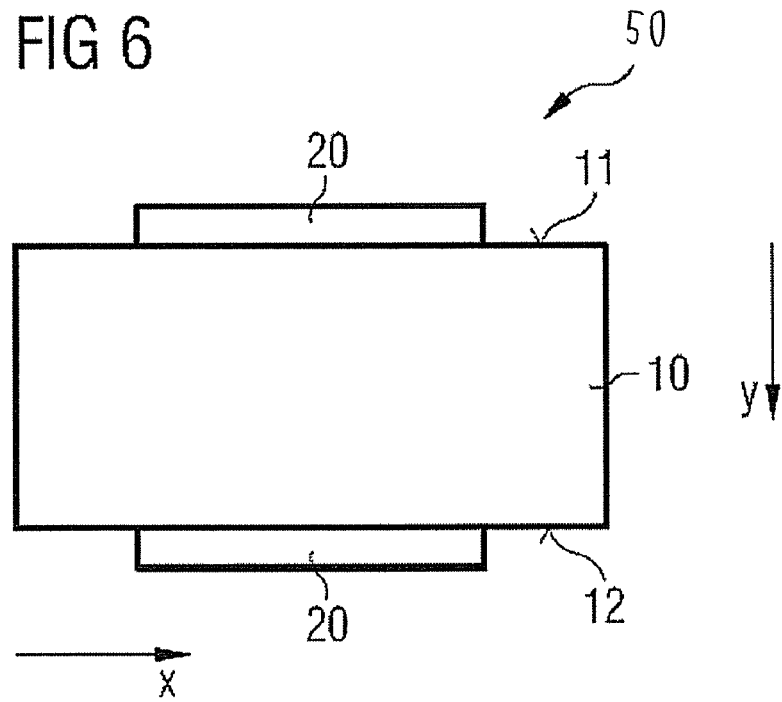
FIG. 6 illustrates a schematic cross-sectional view of a power semiconductor component with a semiconductor body.

FIG. 6 illustrates a power semiconductor component 50. The semiconductor component 50 has a thinned semiconductor body 10 produced according to an embodiment of the method described above. An electrode 20 is fitted to the surface in each case of the first side 11 and of the second side 12 of the semiconductor body 10.

The semiconductor component 50 can be any vertical semiconductor component, that is to say a semiconductor component whose current conduction takes place from the first side transversely through the thickness of the semiconductor body 10 to the second side in the y-direction. In one embodiment, it can be an IGBT, a diode or a thyristor.

The region N2 having the n-type doping maximum $N_{Dmax}$ described in the previous exemplary embodiments can be used as a field stop zone, for example, in the case of an IGBT. The n-type doping maximum $N_{Dmax}$ produced by proton irradiation with subsequent heat treatment can be aligned very exactly to the surface of the second side 12. By virtue of the high proton radiation energy required for producing the n-type dopant maximum $N_{Dmax}$ near to the surface of the second side 12 of the semiconductor body 10 via the first side 11 of the semiconductor body 10, it is possible to radiate through any defects or impurities in or on the semiconductor body without any problems. Consequently, it is possible to set the position of the field stop exactly with respect to the surface of the second side 12 of the semiconductor body 10, which enables a precise setability and high reproducibility of the gain factor $\alpha_{pnp}$ of the collector-side partial transistor of the IGBT. A great variation of the electrical properties of the semiconductor component 50 is thus avoided. Moreover, the very small and well-defined distance—thus possible—of below 5 μm between the field stop zone and the rear-side emitter at the second side 12 ensures a high and reproducible short-circuit strength, a desirable softness when turning off the semiconductor component 50 and avoidance of particle-governed leakage current problems.

The n-doped zone 10a which is produced by using the method explained above and has an n-type doping with hydrogen-induced donors is suitable in one embodiment for realizing a semiconductor zone of a power semiconductor component that takes up a reverse voltage. Such a zone is, for example, the drift zone of a MOSFET, the drift zone or n-type base of an IGBT, or the drift zone or n-type base of a diode.

Figure 7:
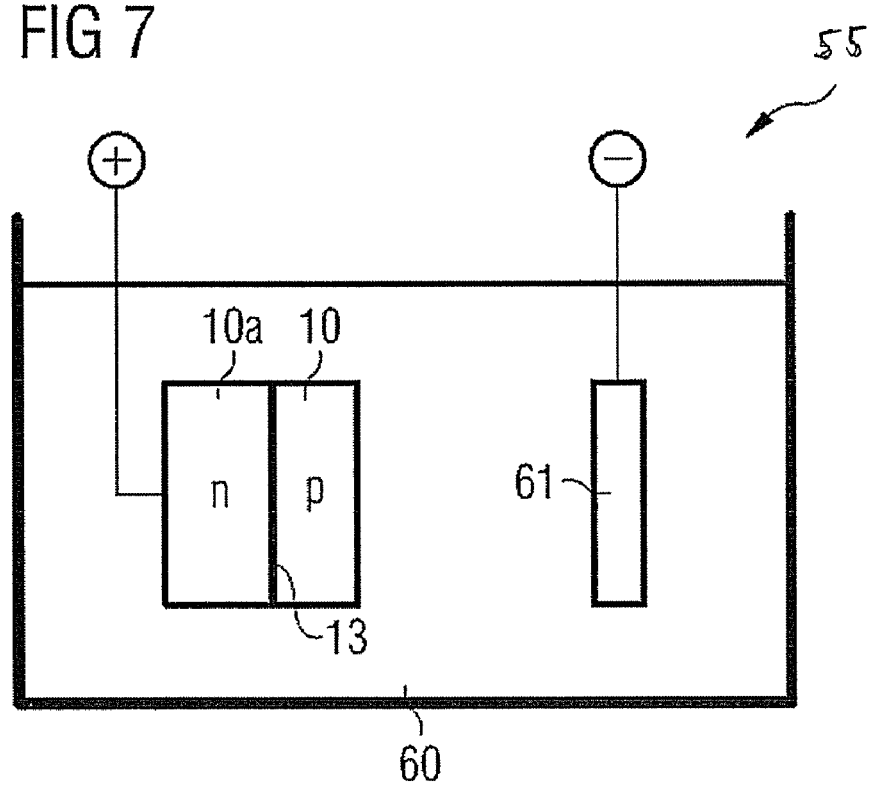
FIG. 7 illustrates a schematic arrangement for the electrochemical etching of a semiconductor body with a pn junction.

FIG. 7 is a schematic illustration of a setup for the electrochemical etching of a p-doped semiconductor body 10 having an n-doped zone 10a and a pn junction 13. An etching cell 55 of the setup includes at least an anode, a cathode 61 and an aqueous alkaline solution 60. The anode is formed by the n-doped zone 10a of the semiconductor body 10 to be thinned, at which a positive potential is present. The cathode 61 is a platinum electrode, for example, at which a negative potential is present. Both the anode and thus the semiconductor body 10 having the n-doped zone 10a and the pn junction 13 and the cathode 61 are immersed in the aqueous alkaline solution 60.

Further embodiments of the etching cell 55 can, for example, also have other etching solutions such as, for example, a pure potassium hydroxide solution (KOH), ethylenediamine (EDP) or hydrazine-water solutions. Further embodiments can also have three or more electrodes. The positive potential can be applied to the contact-connection of the anode, in the present case of the n-doped zone 10a, by using suitable contact structures such as, for example, a net-like contact structure.

The following FIGS. 8-15 illustrate embodiments of a method for producing a silicon on insulator (SOI) material or wafer.

Figure 8:
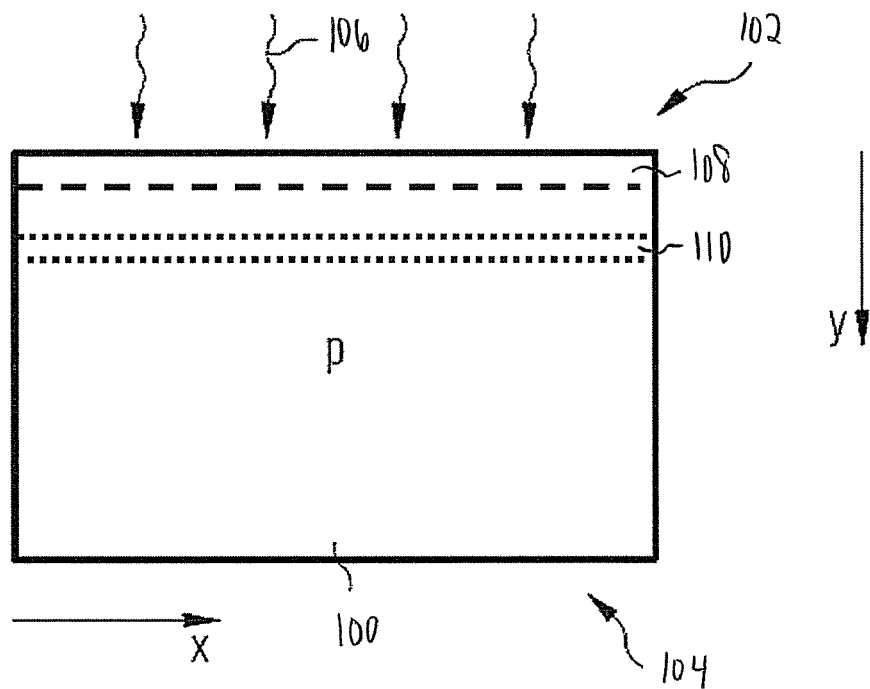
FIG. 8 illustrates one embodiment of implanting a semiconductor body with protons.

FIG. 8 illustrates one embodiment of implanting a semiconductor body 100 with protons 106. Semiconductor body 100 has a first side 102 and a second side 104. In one embodiment, an oxide layer 108 is formed over the first side 102 of semiconductor body 100. The semiconductor body 100 is typically a semiconductor wafer. The starting semiconductor body 100 is doped with a p-type dopant, such that the semiconductor body has a p-type basic doping. The electrical conductivity of the semiconductor body 100 is therefore initially determined by "holes" (p-type charge carriers) as majority carriers. To a certain extent, but with a significantly lower concentration, however, the semiconductor body also already contains conduction electrons (n-type charge carriers) as minority carriers.

Silicon is principally suitable as semiconductor material for the semiconductor body 100. The sheet resistance of the p-doped semiconductor body lies between 1 Ohm cm and 5000 Ohm cm, or between 100 Ohm cm and 5000 Ohm cm, for example. Protons 106 are implanted into the semiconductor body 100 at the first side 102 to a target depth or range indicated at 110. The target depth is based on the energy of the proton implantation. For example, for high voltage integrated circuits, the target depth is typically between 100 nm and 10 µm, for example, which can be obtained with a proton energy between 10 keV and 700 keV.

Figure 9:
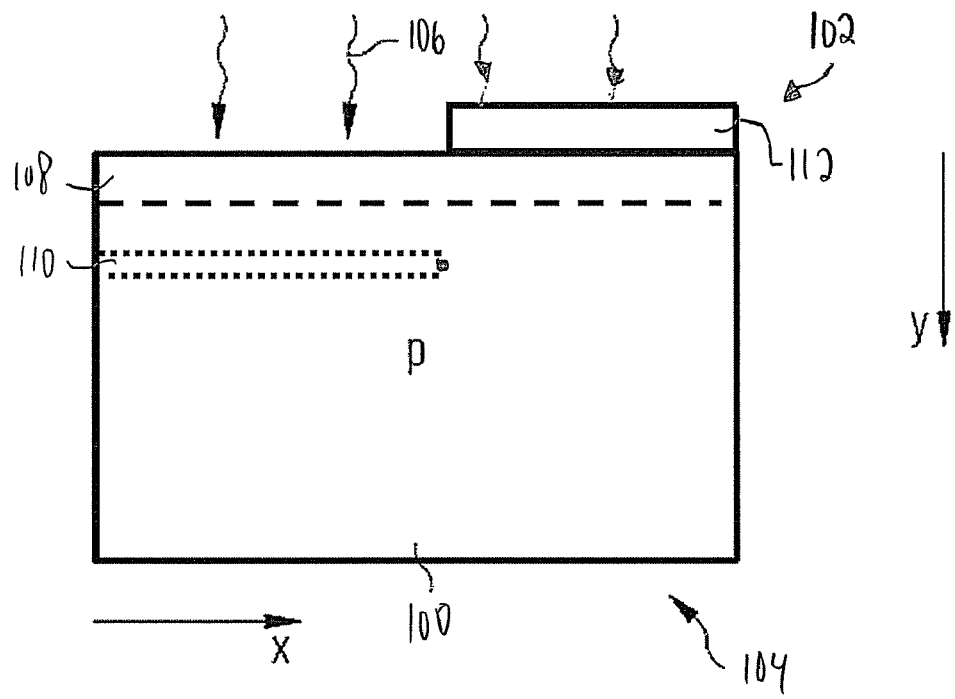
FIG. 9 illustrates one embodiment of implanting portions of a semiconductor body with protons.

FIG. 9 illustrates one embodiment of implanting portions of a semiconductor body 100 with protons 106. In this embodiment, one or more portions of semiconductor body 100 are masked by a mask 112 to prevent implantation of protons into the masked portions of semiconductor body 100. Protons 106 are implanted into the unmasked portions of the semiconductor body 100 at the first side to a target depth or range indicated at 110. In other embodiments, different portions of semiconductor body 100 are implanted with protons 106 to different target depths or ranges based on the device to be produced.

Figure 10:
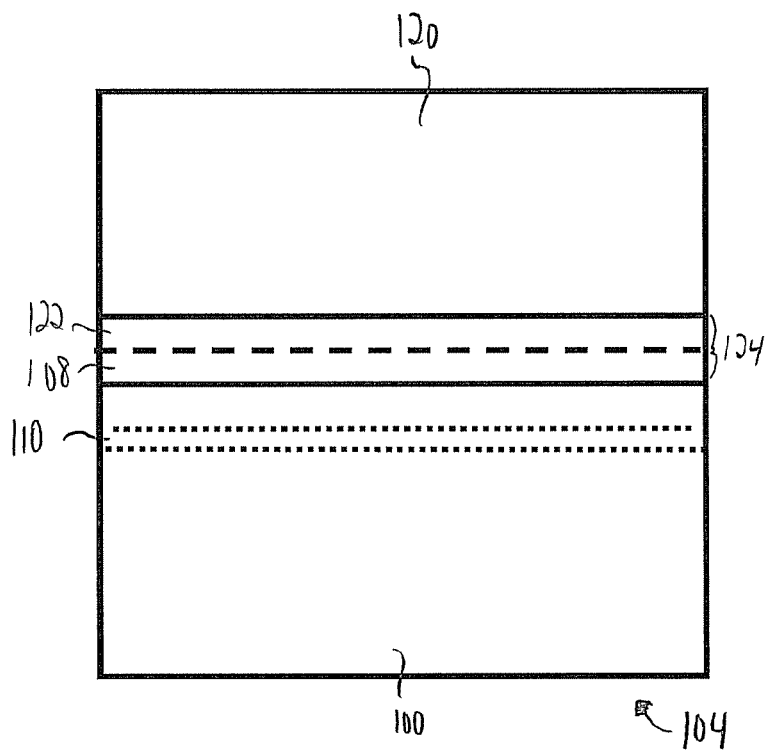
FIG. 10 illustrates one embodiment of bonding the semiconductor body to a carrier substrate.

FIG. 10 illustrates one embodiment of bonding semiconductor body 100 to a carrier substrate 120. The first side 102 of semiconductor body 100 is bonded to carrier substrate 120. In one embodiment, carrier substrate 120 is a semiconductor wafer and includes an oxide layer 122. In one embodiment, oxide layer 122 of carrier substrate 120 is bonded to oxide layer 108 of semiconductor body 100 using a hydrophilic bond process. After bonding, oxide layer 108 and oxide layer 122 provide a combined oxide layer 124. In another embodiment, one of oxide layer 108 and oxide layer 122 is excluded, and semiconductor body 100 is bonded to carrier substrate 120 using a hydrophobic bond process. In one embodiment, semiconductor body 100 and carrier substrate 120 are bonded in a vacuum. In one embodiment after bonding, semiconductor body 100 and carrier substrate 120 are annealed at a temperature below 540° C. to increase the bonding force between semiconductor body 100 and carrier substrate 120.

Figure 11:
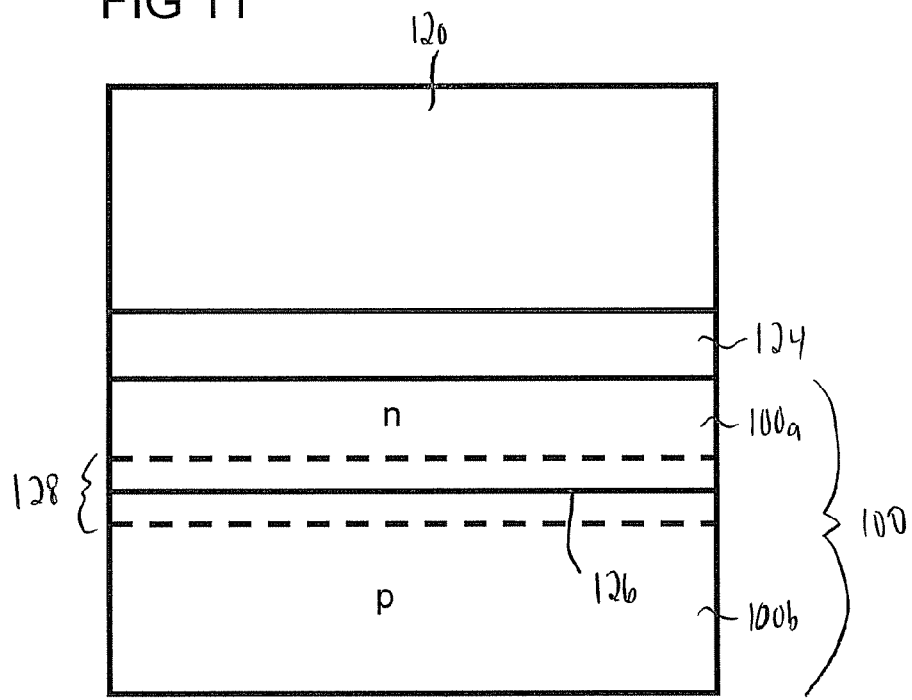
FIG. 11 illustrates one embodiment of annealing the semiconductor body such that a pn junction arises in the semiconductor body.

FIG. 11 illustrates one embodiment of annealing semiconductor body 100 such that a pn junction 126 arises in semiconductor body 100. At least the region of semiconductor body 100 that has been implanted with protons 106 is subjected to heat treatment, that is to say heated and held at this temperature level for a specific time. This gives rise to an n-doped zone 100a and accordingly a pn junction 126 in the p-doped semiconductor body 100. In one embodiment, the n-doped zone 100a is produced with a proton irradiation dose of between $10^{13}$ cm$^{-2}$ and $10^{15}$ cm$^{-2}$ or between $10^{13}$ cm$^{-2}$ and $10^{14}$ cm$^{-2}$.

The energy of the proton radiation 106 is set in such a way that the pn junction 126 is produced at a predetermined location in the semiconductor body 100. In one embodiment, the position of the pn junction is determined according to the desired final thickness of the semiconductor body 100. In the case of a silicon semiconductor body, the proton radiation energy here lies in a range below 700 keV or below 150 keV. In principle the proton radiation energy correlates with the penetration depth of the protons into the semiconductor material used. The higher the proton radiation energy used, the larger the penetration depth of the protons into the semiconductor material used.

The heating (heat treatment) of the semiconductor body 100 that is effected after the proton irradiation in one or more embodiments includes an annealing phase at a temperature below 540° C., such as in the range between 300° C. and 450° C., since the hydrogen-induced n-type doping forms in this temperature range. In one embodiment, the annealing phase is carried out for at least 15 minutes and can also take place over a number of hours.

After the formation of the n-doped zone 100a and the pn junction 126, in thermodynamic equilibrium as a result of diffusion of charge carriers across the pn junction 126, a space charge zone 128 forms extending into the n-doped zone 100a and in the remaining p-doped semiconductor body 100b, since a high concentration difference in the carrier densities exists between the n-doped zone 100a and the remaining p-doped semiconductor body 100b. As a result of the fixed charges remaining, the previously electrically neutral crystals have now acquired a space charge that charges the p-type crystal negatively and the n-type crystal positively. The resultant electrical voltage is called the diffusion voltage $U_D$.

Figure 12:
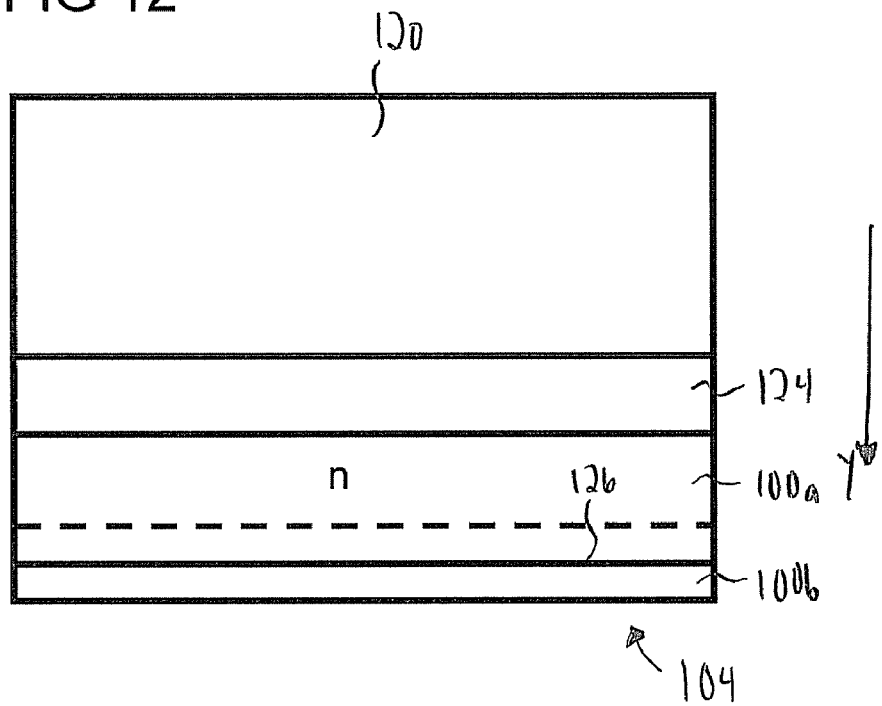
FIG. 12 illustrates one embodiment of thinning the semiconductor body.

FIG. 12 illustrates one embodiment of thinning the semiconductor body 100b. After the formation of pn junction 126 and a space charge zone 128 that possibly occurs, the semiconductor body 100 is thinned. In the case where a space charge zone 128 is spanned at the pn junction 126, this takes place by removing the second side 104 of the semiconductor body 100 in the negative y-direction as far as the space charge zone 128 that is situated in the residual p-doped semiconductor body 100b. Consequently, a region of the semiconductor body is removed, while a residue of the p-doped semiconductor body 100b remains in the thinned state at the second side. By way of example, by using suitable setting of the bias voltage value across the pn junction, the space charge zone can be extended up to 5 µm into the residual p-doped semiconductor body, which results in a correspondingly thick p-doped residual layer 100b after the thinning. In the case of a dissolved space charge zone 128, the second side is removed as far as the pn junction 126, that is to say that the residue 100b of the p-doped semiconductor body that remained from the original semiconductor body 100 after the production of the n-doped zone 100a is completely removed.

The removal of the second side 104 can in any case be effected in a locally delimited manner by using masks for the proton implantation or for the etching process, for example, or else over the whole area over the entire semiconductor body 100. The removal is generally effected at least in part by using an electrochemical etching method as previously described and illustrated with reference to FIG. 7. The electrical contact to n-doped zone 100a for the electrochemical etching can be made directly to n-doped zone 100a or via a contact through carrier substrate 120 and oxide layer 124. For the electrochemical etching, the boundary of the space charge zone or, in the absence of a space charge zone, the pn junction is used as an "etching stop" for ending the etching process. When this "etching stop" is reached, the etching process automatically terminates; in other words, the etching stop is effected in a self-aligned manner in this way. A very exact removal of the second side 104 of the semiconductor body 100 is thus possible. By way of example, a characteristic change in a current flowing within the electrochemical etching apparatus is measured when the "etching stop" is reached, which is used for ending the etching process. If desired, an additional short etching step can be performed after this well-defined thinning process to remove a thin layer of the semiconductor material. Mechanical assisted removal methods, such as chemical mechanical polishing (CMP), can also be used at the beginning of the removal of the second side 104 of the semiconductor body 100.

Figure 13:
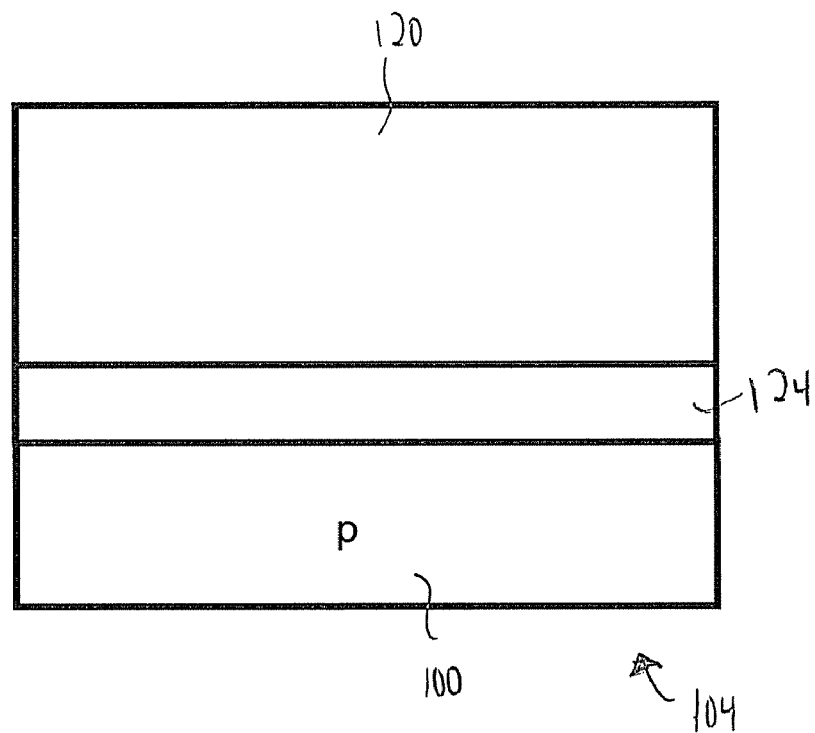
FIG. 13 illustrates one embodiment of annealing the semiconductor body to remove the n-type dopants.

FIG. 13 illustrates one embodiment of annealing semiconductor body 100 to remove the n-type dopants. Semiconductor body 100 is subjected to heat treatment to remove the proton doping and to further improve the bond between carrier substrate 120 and semiconductor body 100. The heating (heat treatment) of the semiconductor body 100 includes an annealing phase in a temperature above 540° C., such as in the range between 600° C. and 1250° C. After annealing, a SOI wafer is provided including a semiconductor body 100, an oxide layer 124, and a carrier substrate 120. If desired, an additional short etching step or mechanical assisted removal methods, such as chemical mechanical polishing (CMP), can be applied to the semiconductor body 100 from the surface of the SOI wafer.

In one embodiment, to produce a thin semiconductor device, carrier substrate 120 is thinned starting from the second side 104 or is removed from semiconductor body 100 after further processing. In one embodiment, after carrier substrate 120 is removed, oxide layer 124 is also removed from semiconductor body 100 using a selective etching process.

Figure 14:
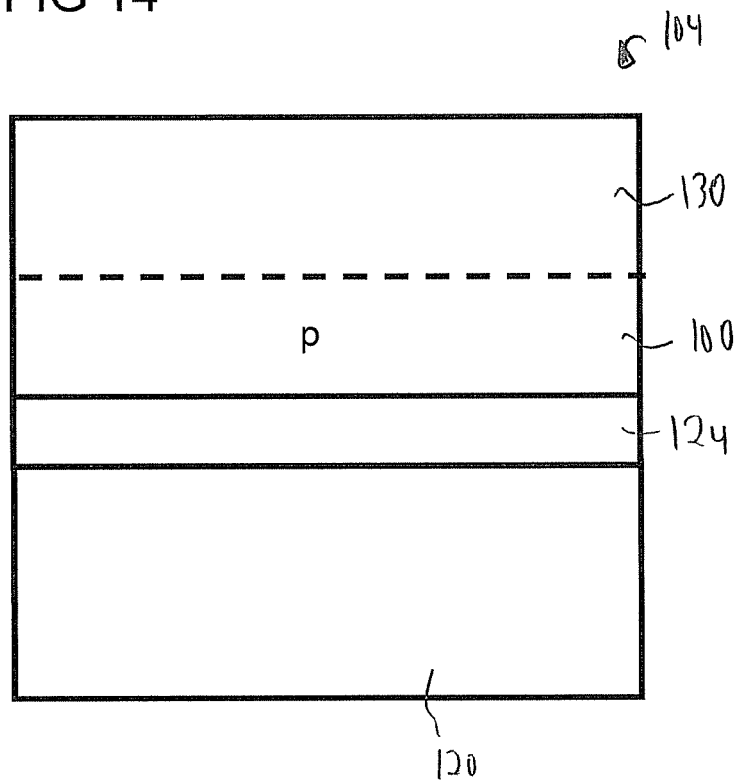
FIG. 14 illustrates one embodiment of growing an epitaxial layer on the semiconductor body.

FIG. 14 illustrates one embodiment of growing an epitaxial layer 130 on semiconductor body 100. In one embodiment, to obtain a desired thickness of semiconductor body 100, an epitaxial layer 130 is grown on semiconductor body 100 to provide epitaxial layer 130. In one embodiment, semiconductor body 100 is implanted with dopants prior to growing epitaxial layer 130 to achieve a suitable doping profile for a semiconductor device, such as a power semiconductor device.

Figure 15:
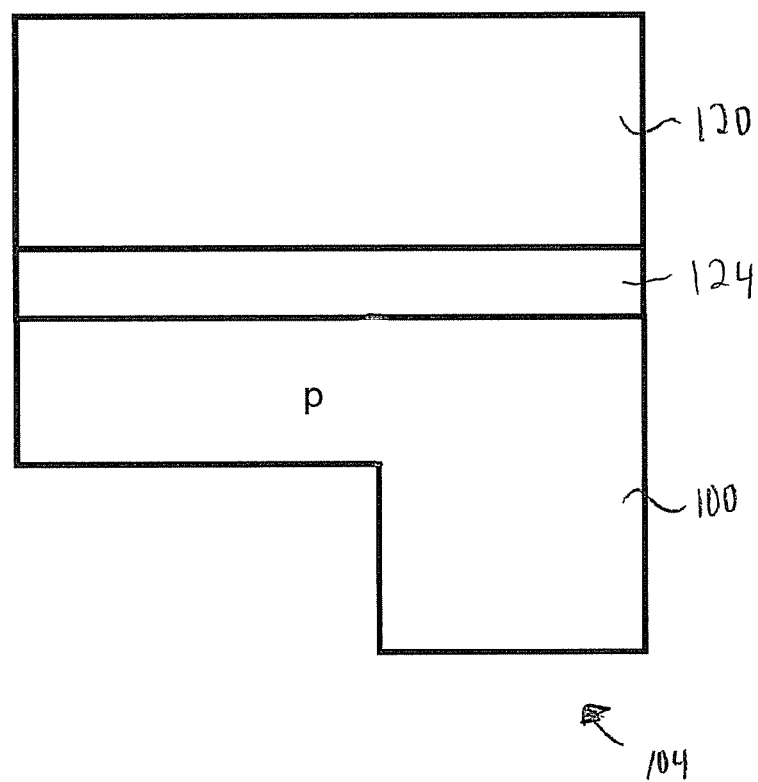
FIG. 15 illustrates one embodiment of a semiconductor body where a portion of the semiconductor body is thinned.

FIG. 15 illustrates one embodiment of a semiconductor body 100 where a portion of the semiconductor body is thinned. In this embodiment, a portion of semiconductor body 100 was masked prior to implanting the protons as previously described and illustrated with reference to FIG. 9. In one embodiment, semiconductor body 100 with thinned portions and unthinned portions, or differently thinned portions, is used to produce lateral high voltage transistors or other suitable semiconductor devices.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A method for producing a semiconductor, comprising:
   providing a p-doped semiconductor body having a first side and a second side;
   forming an n-doped zone in the semiconductor body by implantation of protons into the semiconductor body via the first side down to a specific depth of the semiconductor body and by subsequent heating at least of the proton-implanted region of the semiconductor body, such that a pn junction arises in the semiconductor body;
   producing an n-type doping maximum in the n-doped zone nearer to the pn junction than to the surface of the first side of the semiconductor body;
   removing the second side of the semiconductor body at least as far as a space charge zone spanned at the pn junction; and
   fitting a first electrode to the semiconductor body.

2. The method of claim 1, comprising effecting the implantation of the protons with an implantation energy lying in the range of between 1 MeV and 8 MeV.

3. The method of claim 1, comprising producing the pn junction at a depth T in the range of 20 μm to 350 μm, measured from a surface of the first side.

4. The method of claim 1, wherein the heating comprises an annealing phase in a temperature range of between 350° C. and 550° C.

5. The method of claim 4, wherein the annealing phase has a duration of at least 15 min.

6. The method of claim 1, wherein the heating includes an annealing phase in a temperature range of between 450° C. and 520° C.

7. The method of claim 1, comprising forming the space charge zone by diffusion of charge carriers across the pn junction.

8. The method of claim 1, comprising forming the space charge zone by applying a bias voltage across the pn junction; and
   polarizing the bias voltage across the pn junction in the reverse direction of the pn junction.

9. The method of claim 8, comprising setting the bias voltage value such that the space charge zone extends between 0.5 μm and 5 μm into the p-doped semiconductor body.

10. The method of claim 9, comprising effecting at least a last part of the removal of the second side by electrochemical etching.

11. A method for producing a semiconductor comprising:
    providing a p-doped semiconductor body having a first side and a second side;
    forming an n-doped zone in the semiconductor body by implantation of protons into the semiconductor body via the first side down to a specific depth of the semiconductor body and by subsequent heating at least of the proton-implanted region of the semiconductor body, such that a pn junction arises in the semiconductor body;
    forming a space charge zone by applying a bias voltage across the pn junction;
    polarizing the bias voltage across the pn junction in the forward direction of the pn junction; and
    removing the second side of the semiconductor body at least as far as the space charge zone spanned at the pn junction.

12. The method of claim 11, comprising setting a width W of the space charge zone by setting a specific bias voltage value across the pn junction.

13. The method of claim 11, wherein the bias voltage is greater than a diffusion voltage UD of the space charge zone across the pn junction, with the result that the space charge zone is dissolved.

14. The method of claim 13, wherein the removal of the second side ends at the pn junction.

15. A method for producing a semiconductor comprising:
    producing an n-type doping maximum in an n-doped zone;
    providing a p-doped semiconductor body having a first side and a second side;
    forming the n-doped zone in the semiconductor body by implantation of protons into the semiconductor body via the first side down to a specific depth of the semiconductor body and by subsequent heating at least of the proton-implanted region of the semiconductor body, such that a pn junction arises in the semiconductor body;
    removing the second side of the semiconductor body at least as far as a space charge zone spanned at the pn junction; and
    producing the n-type doping maximum nearer to the pn junction than to the surface of the first side of the semiconductor body.

16. A method for producing a semiconductor comprising:
    producing an n-type doping maximum in an n-doped zone;

providing a p-doped semiconductor body having a first side and a second side;

forming the n-doped zone in the semiconductor body by implantation of protons into the semiconductor body via the first side down to a specific depth of the semiconductor body and by subsequent heating at least of the proton-implanted region of the semiconductor body, such that a pn junction arises in the semiconductor body;

removing the second side of the semiconductor body at least as far as a space charge zone spanned at the pn junction; and producing the n-type doping maximum by a further proton implantation with subsequent heating.

17. The method of claim 16, comprising effecting the further proton implantation via the first side of the semiconductor body.

18. A method for producing a semiconductor comprising:
producing an n-type doping maximum in an n-doped zone;
providing a p-doped semiconductor body having a first side and a second side;
forming the n-doped zone in the semiconductor body by implantation of protons into the semiconductor body via the first side down to a specific depth of the semiconductor body and by subsequent heating at least of the proton-implanted region of the semiconductor body, such that a pn junction arises in the semiconductor body;
removing the second side of the semiconductor body at least as far as a space charge zone spanned at the pn junction; and
producing a region having a virtually constant n-type doping concentration ND between the n-type doping maximum and the surface of the first side of the semiconductor body in the n-doped zone.

19. A method for producing a semiconductor comprising:
producing an n-type doping maximum in an n-doped zone;
providing a p-doped semiconductor body having a first side and a second side;
forming the n-doped zone in the semiconductor body by implantation of protons into the semiconductor body via the first side down to a specific depth of the semiconductor body and by subsequent heating at least of the proton-implanted region of the semiconductor body, such that a pn junction arises in the semiconductor body;
removing the second side of the semiconductor body at least as far as a space charge zone spanned at the pn junction; and
producing a region having an n-type dopant minimum between the n-type doping maximum and the pn junction in the n-doped zone.

20. A method for producing a semiconductor comprising:
producing an n-type doping maximum in an n-doped zone;
providing a p-doped semiconductor body having a first side and a second side;
forming the n-doped zone in the semiconductor body by implantation of protons into the semiconductor body via the first side down to a specific depth of the semiconductor body and by subsequent heating at least of the proton-implanted region of the semiconductor body, such that a pn junction arises in the semiconductor body;
removing the second side of the semiconductor body at least as far as a space charge zone spanned at the pn junction; and
forming an n-doped shoulder in a region between the n-type doping maximum and the pn junction in the n-doped zone, wherein in the shoulder the n-type doping concentration ND changes by at most a factor of 3 over a length of 1 to 5 pm.

21. The method of claim 20, comprising producing the n-doped zone with a proton irradiation dose of between $10^{14}$ cm$^{-2}$ and $10^{15}$ cm$^{-2}$.

22. The method of claim 21, wherein the semiconductor body is a silicon wafer.

23. A method comprising:
producing a power semiconductor component comprising:
providing a p-doped semiconductor body having a first side and a second side;
forming an n-doped zone in the semiconductor body by implantation of protons into the semiconductor body via the first side down to a specific depth of the semiconductor body and by subsequent heating at least of the proton-implanted region of the semiconductor body, such that a pn junction arises in the semiconductor body;
removing the second side of the semiconductor body at least as far as a space charge zone spanned at the pn junction; and
producing an n type doping maximum in the n-doped zone by a further proton implantation with subsequent heating; and
fitting a first electrode to the semiconductor body.

24. A method for producing a semiconductor, the method comprising:
providing a p-doped semiconductor body having a first side and a second side;
implanting protons into the semiconductor body via the first side to a target depth of the semiconductor body;
bonding the first side of the semiconductor body to a carrier substrate;
forming an n-doped zone in the semiconductor body by heating the semiconductor body such that a pn junction arises in the semiconductor body;
forming a space charge zone by applying a bias voltage across the pn junction;
polarizing the bias voltage across the pn junction in the forward direction of the pn junction; and
removing the second side of the semiconductor body at least as far as the space charge zone spanned at the pn junction.

25. The method of claim 24, further comprising:
further heating the semiconductor body to remove the proton-induced n-doping from the semiconductor body after removing the second side of the semiconductor body at least as far as the space charge zone spanned at the pn junction.

26. The method of claim 25, wherein the further heating includes an annealing phase in a temperature greater than 540° C.

27. The method of claim 24, wherein providing the p-doped semiconductor body comprises providing a p-doped semiconductor body comprising an oxide layer over the first side.

28. The method of claim 24, wherein bonding the first side of the semiconductor body to the carrier substrate comprises bonding the first side of the semiconductor body to an oxide layer of the carrier substrate.

29. The method of claim 24, wherein the heating comprises an annealing phase in a temperature less than 540° C.

30. The method of claim 24, further comprising:
growing an epitaxial layer on the second side of the semiconductor body after removing the second side of the semiconductor body at least as far as the space charge zone spanned at the pn junction.

31. The method of claim 24, wherein implanting the protons comprises implanting the protons with a proton dose between $10^{13}$ cm$^{-2}$ and $10^{15}$ cm$^{-2}$.

32. The method of claim 24, wherein implanting the protons comprises implanting the protons with a proton radiation energy below 150 keV.

33. The method of claim 24, wherein bonding the first side of the semiconductor body to the carrier substrate comprises a hydrophilic bond process.

34. A method for producing a silicon on insulator (SOI) wafer, the method comprising:
    providing a p-doped silicon wafer having a first side and a second side;
    implanting protons into the silicon wafer via the first side to a target depth of the silicon wafer;
    bonding the first side of the silicon wafer to a first side of a carrier wafer;
    forming an n-doped zone in the silicon wafer by heating the silicon wafer and the carrier wafer such that a pn junction arises in the silicon wafer;
    forming a space charge zone by applying a bias voltage across the pn junction;
    polarizing the bias voltage across the pn junction in the forward direction of the pn junction; and
    removing the second side of the silicon wafer at least as far as the space charge zone spanned at the pn junction,
    wherein a silicon oxide layer covers at least one of the first side of the silicon wafer and the first side of the carrier wafer.

35. The method of claim 34, further comprising:
    further heating the silicon wafer to remove the proton-induced n-doping from the silicon wafer after removing the second side of the silicon wafer at least as far as the space charge zone spanned at the pn junction.

36. The method of claim 34, wherein removing the second side of the silicon wafer comprises:
    grinding a first portion of the second side of the silicon wafer; and
    etching a second portion of the second side of the silicon wafer to the space charge zone spanned at the pn junction.

37. The method of claim 36, wherein etching comprises electrochemical etching.

38. The method of claim 34, wherein providing the p-doped silicon wafer comprises providing a p-doped silicon wafer comprising a silicon oxide layer over the first side, and wherein the first side of the carrier wafer comprises a silicon oxide layer.

39. A method comprising:
    producing a semiconductor component comprising:
        providing a p-doped semiconductor body having a first side and a second side;
        implanting protons into the semiconductor body via the first side to a target depth of the semiconductor body;
        bonding the first side of the semiconductor body to a carrier substrate;
        forming an n-doped zone in the semiconductor body by heating the semiconductor body and the carrier substrate such that a pn junction arises in the semiconductor body;
        removing the second side of the semiconductor body at least as far as a space charge zone spanned at the pn junction;
        further heating the semiconductor body to remove the proton-induced n-doping from the semiconductor body;
        fabricating a semiconductor device on the second side of the semiconductor body; and
        masking portions of the first side,
        wherein implanting the protons comprises implanting the protons into unmasked portions of the semiconductor body via the first side to a target depth of the semiconductor body.

40. The method of claim 39, further comprising:
    growing an epitaxial layer on the second side of the semiconductor body after the further heating of the semiconductor body to remove the protons from the semiconductor body.

41. The method of claim 39, wherein providing the p-doped semiconductor body comprises providing a p-doped semiconductor body comprising an oxide layer over the first side.

42. The method of claim 39, wherein bonding the first side of the semiconductor body to the carrier substrate comprises bonding the first side of the semiconductor body to an oxide layer of the carrier substrate.

* * * * *

UNITED STATES PATENT AND TRADEMARK OFFICE
CERTIFICATE OF CORRECTION

PATENT NO. : 8,288,258 B2  
APPLICATION NO. : 12/769976  
DATED : October 16, 2012  
INVENTOR(S) : Mauder et al.

Page 1 of 1

It is certified that error appears in the above-identified patent and that said Letters Patent is hereby corrected as shown below:

Title Page, below Item (63), please add the following:

-- (30)    Foreign Application Priority Data  
May 29, 2008        (DE)        10 2008 025 733.8 --

Signed and Sealed this  
Fifteenth Day of April, 2014

Michelle K. Lee  
*Deputy Director of the United States Patent and Trademark Office*